(12) United States Patent
Gabara et al.

(10) Patent No.: US 7,274,264 B2
(45) Date of Patent: Sep. 25, 2007

(54) LOW-POWER-DISSIPATION CMOS OSCILLATOR CIRCUITS WITH CAPACITIVELY COUPLED FREQUENCY CONTROL

(75) Inventors: Thaddeus Gabara, New Providence, NJ (US); Vladimir Prodanov, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 31 days.

(21) Appl. No.: 11/020,023

(22) Filed: Dec. 22, 2004

(65) Prior Publication Data

US 2006/0132249 A1    Jun. 22, 2006

(51) Int. Cl.
*H03B 1/00* (2006.01)
(52) U.S. Cl. ............................ 331/117 FE; 331/117 R; 331/167; 331/185; 331/177 V
(58) Field of Classification Search .......... 331/117 FE, 331/117 R, 177 V, 167, 185
See application file for complete search history.

(56) References Cited

U.S. PATENT DOCUMENTS

| | | | | |
|---|---|---|---|---|
| 5,396,195 A | | 3/1995 | Gabara | .................. 331/113 R |
| 6,064,277 A | * | 5/2000 | Gilbert | .................. 331/117 R |
| 6,867,658 B1 | * | 3/2005 | Sibrai et al. | ................ 331/185 |
| 6,927,643 B2 | * | 8/2005 | Lazarescu et al. | .......... 331/186 |

OTHER PUBLICATIONS

Yamagishi et al., "A Low-Voltage 6-GHz-Band CMOS Monolithic LC-Tank Using a Tuning-Range Switching Technique," Microwave Symposium Digest, IEEE MTTS-S International, vol. 2, pp. 735-738 (Jun. 11-16, 2000) (Abstract).
Zhang et al., "Monolithic Multi-Phase LC-VCO in Ultra-Thin Silicon-on-Insulator (UTSi/spi reg/-SOI) CMOS Technology," Circuits and Systems, ISCAS IEEE International Symposium, vol. 2, pp. II-804-806 (May 26-29, 2002) (Abstract).

* cited by examiner

*Primary Examiner*—Arnold Kinkead

(57) ABSTRACT

Methods and apparatus are disclosed for adjusting the frequency tuning range of an oscillator circuit. The oscillator circuit is comprised of at least two MOS devices; a first reactance connecting a drain electrode of a first MOS device to a gate electrode of a second MOS device and a second reactance connecting a drain electrode of the second MOS device to a gate electrode of the first MOS device; and a tank circuit connected to the source and drain electrodes. The first and second reactance may comprises a capacitor or a diode or a combination thereof. In addition, one or more resistors may optionally be connected between a gate electrode of at least one of the MOS device and a power source.

21 Claims, 4 Drawing Sheets

US 7,274,264 B2

LOW-POWER-DISSIPATION CMOS OSCILLATOR CIRCUITS WITH CAPACITIVELY COUPLED FREQUENCY CONTROL

FIELD OF THE INVENTION

The present invention is related to low-power-dissipation oscillator circuits and, more particularly, to frequency control techniques for such low-power-dissipation oscillator circuits.

BACKGROUND OF THE INVENTION

Microprocessors, digital signal processors (DSPs) and other synchronous digital logic circuits require a clock signal to maintain synchronization and to control operations. One limitation to the processing power of a processor embodied on an integrated circuit chip is the amount of power the processor can dissipate. Similarly, in portable applications, such as wireless communications, battery capacity can limit the amount of power a chip can consume.

A number of low-power-dissipation oscillator circuits have been proposed or suggested. One popular design is disclosed in U.S. Pat. No. 5,396,195, entitled "Low-Power-Dissipation CMOS Oscillator Circuits," to Gabara, incorporated by reference herein. The disclosed Gabara Oscillator comprises a pair of cross-connected metal-oxide-semiconductor (MOS) devices and an associated inductor-capacitor (LC) tank circuit. Generally, the drain electrode of the first MOS device is directly connected to the gate electrode of the second MS device and the drain electrode of the second MOS device is directly connected to the gate electrode of the first MOS device.

In addition, a number of techniques have been proposed or suggested for adjusting the frequency tuning range of such low-power-dissipation oscillator circuits. For example, A. Yamagishi et al., Microwave Symposium Digest., 2000 IEEE MTT-S Int'l, Vol. 2, 735-738, (June, 2000) discloses a low-voltage 6-GHz-band CMOS monolithic LC-tank VCO using a tuning-range switching technique. In addition, Lip-ing Zhang and A. A. Sawchuk, Circuits and Systems, 2002. ISCAS 2002. IEEE International Symposium on Circuits and Systems, Vol. 2, II-804-II-806 (May, 2002), discloses a monolithic multi-phase LC-tank VCO.

These representative techniques for adjusting the frequency tuning range of oscillator circuits both employ varactors such that the capacitance is applied directly to the output nodes of the LC tank circuit (which typically contains a certain amount of parasitic capacitance). These parasitic capacitances can be quite large when compared to the capacitance of the varactor. If these parasitic capacitances dominate the capacitance being introduced into the LC tank circuit, then the adjustable frequency range of the varactor control will be reduced. A need therefore exists for methods and apparatus for adjusting the frequency tuning range of oscillator circuits with improved adjustable frequency range.

SUMMARY OF THE INVENTION

Generally, methods and apparatus are disclosed for adjusting the frequency tuning range of an oscillator circuit. The oscillator circuit is comprised of at least two MOS devices; a first reactance connecting a drain electrode of a first MOS device to a gate electrode of a second MOS device and a second reactance connecting a drain electrode of the second MOS device to a gate electrode of the first MOS device; and a tank circuit connected to the source and drain electrodes. The first and second reactance may comprises a capacitor or a diode or a combination thereof. In addition, one or more resistors may optionally be connected between a gate electrode of at least one of the MOS device and a power source.

From the process point of view, a method is disclosed for adjusting the frequency tuning range of the oscillator circuit. An oscillating signal is generated using a pair of MOS devices and an associated tank circuit; a voltage is generated at a gate of one or more of the MOS devices using a first reactance connected between a drain electrode of a first MOS device and a gate electrode of a second MOS device and a second reactance connected between a drain electrode of the second MOS device and a gate electrode of the first MOS device; and the frequency of the oscillating signal is adjusted by biasing one or more of first and second the MOS devices.

A more complete understanding of the present invention, as well as further features and advantages of the present invention, will be obtained by reference to the following detailed description and drawings.

DETAILED DESCRIPTION

Figure 1:
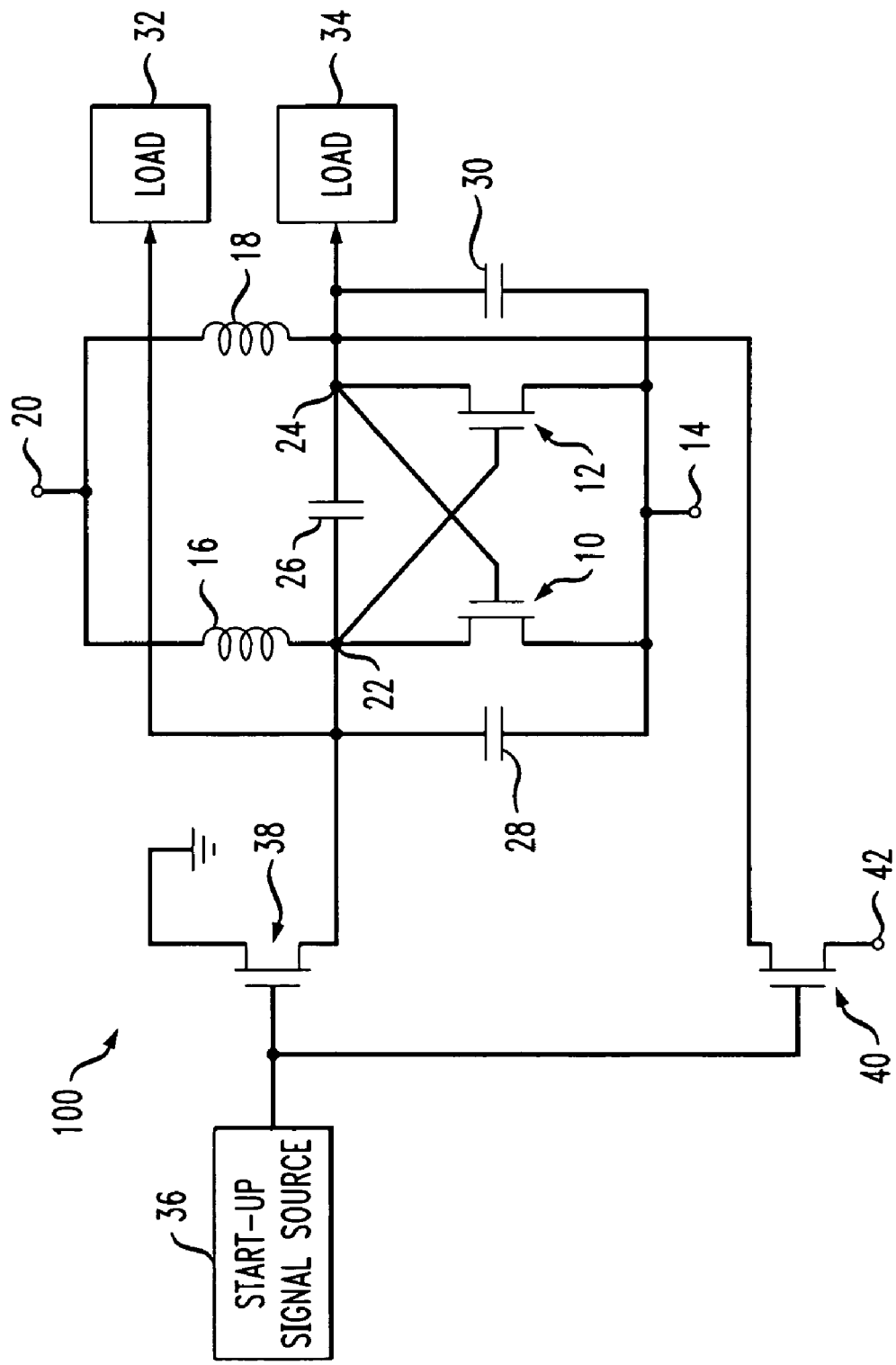
FIG. 1 is a schematic circuit diagram illustrating an exemplary conventional low-power-dissipation oscillator circuit.

The exemplary conventional oscillator circuit 100 shown in FIG. 1 comprises two conventional n-channel MOS devices 10 and 12. The devices 10 and 12 are assumed to be substantially identical to each other. The lower or source electrode of each of the devices 10 and 12 of FIG. 1 is connected to a source or power supply 14. The source 14 will be designated herein as $V_{SS}$ and will, illustratively, be assumed to be a direct-current supply having a value of about −5.0 volts. The upper or drain electrodes of the devices 10 and 12 are connected through respective inductors 16 and 18 to a source 20. Herein, the source 20 will be designated $V_{SS}/2$ and will, for example, be assumed to have a value of about −2.5 volts. The gate electrode of the right-hand MOS device 12 of FIG. 1 is directly connected to the drain electrode of the left-hand MOS device 10 at a node point 22. Similarly, the gate electrode of the left-hand MOS device 10 is directly connected to the drain electrode of the right-hand device 12 at a node point 24.

A capacitor 26 is directly connected between the node points 22 and 24 shown in FIG. 1. Two additional capacitors 28 and 30 are indicated as being connected between the node points 22 and 24 and the source 14. The inductors 16 and 18 and the capacitors 26, 28 and 30 constitute an LC tank circuit for the depicted oscillator. It is noted that the capacitors 26, 28 and 30 may include the parasitic capacitance of devices 10 and 12.

The circuit of FIG. 1 provides a sine-wave voltage output at the node point 22 and a complementary such output at the node point 24. In other words, the sine waves provided at the node points 22 and 24 are 180 degrees out of phase with respect to each other.

The output appearing at the node point 22 of FIG. 1 is connected to a load 32, while the output at the node point 24 is connected to a load 34. Illustratively, both loads are capacitive in nature. Advantageously, the loads 32 and 34 are, for example, MOS devices included in a network which is controlled by the signals generated at the node points 22 and 24.

To ensure reliable operation of the circuit 100, it is advantageous to provide start-up circuitry to drive the depicted circuit into its steady-state oscillatory mode. By way of example, such start-up circuitry includes a start-up signal source 36 and n-channel MOS devices 38 and 40, as shown in FIG. 1. The drain electrode of the device 38 of FIG. 1 is connected to a point of reference potential such as ground, and the source electrode thereof is connected to the node point 22. Further, the source electrode of the device 40 is connected to a source 42 having the same value as that of the source 14, and the drain electrode thereof is connected to the node point 24. And the gate electrodes of both of the devices 38 and 40 are connected to the output of the start-up signal source 36.

The start-up signal source 36 of FIG. 1 applies either $V_{SS}$ (−5.0 volts) or 0 volts (ground) to the gates of the MOS devices 38 and 40. As long as −5.0 volts is applied to their gates, the devices 38 and 40 are nonconductive and the start-up circuitry is in effect disabled.

Initially, with the start-up circuitry disabled but the remainder of the circuit shown in FIG. 1 energized, it is possible that the voltages at the node points 22 and 24 will assume a condition in which they are approximately equal. In that case, the currents through the inductors 16 and 18 will also be approximately equal. As a result, the circuit would remain in a balanced or non-oscillatory steady-state condition. By applying a start-up signal to the circuit 100, the circuit 100 is unequivocally driven into its desired oscillatory state.

The application of the start-up signal to the gates of the MOS devices 38 and 40 causes these devices to be rendered conductive. As a result, the voltage of the node point 22 is driven in a positive direction while the voltage of the node point 24 is driven in a negative direction. At the same time, the current through the inductor 16 decreases while the current through the inductor 18 increases. In this manner, the initially balanced condition of the circuit is altered by the start-up signal.

When the start-up signal returns to the value $V_{SS}$, the devices 38 and 40 in the start-up circuitry are rendered nonconductive. At that time, the oscillator circuit is in an unbalanced condition, with energy stored in the inductors 16 and 18 and the capacitors 26, 28 and 30. Subsequently, due to the energy stored in the tank circuit and the regenerative feedback action of the cross-connected MOS devices 10 and 12, oscillations build up until an output sine-wave signal appears at the node point 22 and a complementary output sine-wave signal appears at the node point 24.

Each of the sine waves has a maximum value of 0 volts and a minimum value of $V_{SS}$ (−5.0 volts). The mid-point of each sine wave occurs at $V_{SS}/2$. The two sine waves are 180 degrees out of phase with respect to each other.

Figure 2:
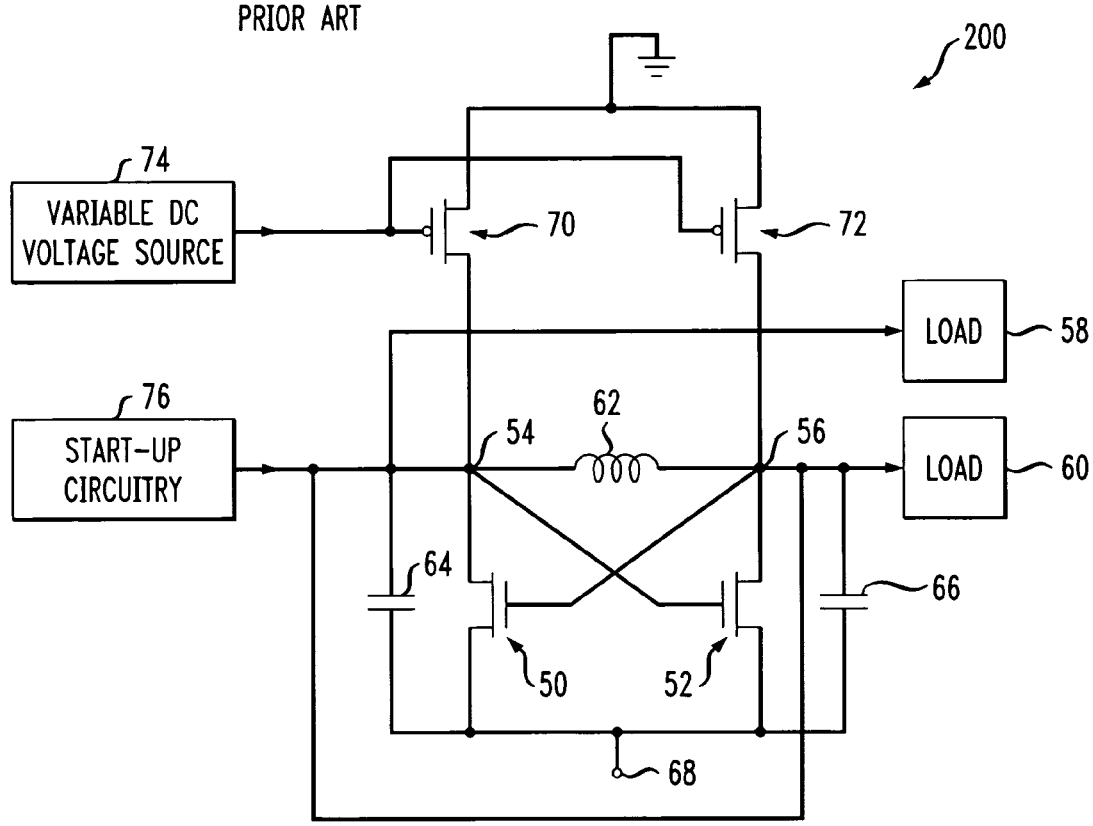
FIG. 2 is a schematic circuit diagram illustrating an alternative conventional low-power-dissipation oscillator circuit.

FIG. 2 is a schematic circuit diagram illustrating an alternative conventional low-power-dissipation oscillator circuit 200. The oscillator circuit 200 shown in FIG. 2 is similar to the circuit 100 of FIG. 1. Thus, the FIG. 2 arrangement also includes cross-connected n-channel MOS devices, which are designated by reference numerals 50 and 52. In FIG. 2, output nodes 54 and 56 are connected to loads 58 and 60, respectively. An inductor 62 (rather than a capacitor as in FIG. 1) is connected between the output node points. The inductor 62 together with capacitors 64 and 66 constitute the tank circuit of the FIG. 2 arrangement. It is again noted that the capacitors 64 and 66 may include the parasitic capacitance of devices 50, 52 and 72.

Further, the source electrodes of the devices 50 and 52 of FIG. 2, as well as the bottom plates of the capacitors 64 and 66, are connected to a source 68 which is designated $V_{SS}$. Illustratively, the source 68 has a value of approximately −5.0 volts.

The oscillator circuit 200 of FIG. 2 also includes p-channel MOS devices 70 and 72 respectively connected between a point of reference potential such as ground and the drain electrodes of the devices 50 and 52. By varying the direct-current voltage applied to the gate electrodes of the devices 70 and 72, it is possible to change the frequency at which the depicted circuit oscillates. A source 74 for accomplishing this frequency variation is shown in FIG. 2.

Advantageously, the circuit 200 of FIG. 2 also includes start-up circuitry 76 of the same type described above and included in the FIG. 1 circuit. In this manner, the circuit 200 of FIG. 2 is controlled to achieve a steady-state oscillatory condition.

For a detailed discussion of the fabrication and representative examples of the circuits 100, 200, see U.S. Pat. No. 5,396,195, entitled "Low-Power-Dissipation CMOS Oscillator Circuits," to Gabara, incorporated by reference herein above.

As previously indicated, existing techniques for adjusting the frequency tuning range of oscillator circuits apply the capacitance directly to the output nodes of the LC tank circuit (which typically contains a certain amount of parasitic capacitance). The present invention recognizes that the varactor can be placed in a region where the parasitic capacitance is reduced so that the overall effective variation of the frequency controlling capacitance can be used to adjust the frequency behavior of the LC tank circuit over a larger range. Thus, while it was previously assumed that a direct connection was required to cross-couple the MOS devices 10 and 12, the present invention recognizes that these MOS devices can be connected through a reactance, such as capacitors, diodes, or a combination thereof, that introduces a low impedance in the cross-coupled MOS devices. Essentially, the reactance appears like an open circuit at lower frequencies and a short circuit at higher frequencies (and thus appears like the direct connection of the cross-coupled devices of the Gabara Oscillator).

Generally, the varactor capacitance is placed before the amplifying element, rather than after the amplifying element. In one particular implementation, the amplifying element actually serves as the varactor element. According to one aspect of the invention, the gate of the MOS devices are isolated from the rest of the circuit and the varactor is positioned at this junction.

Figure 3:
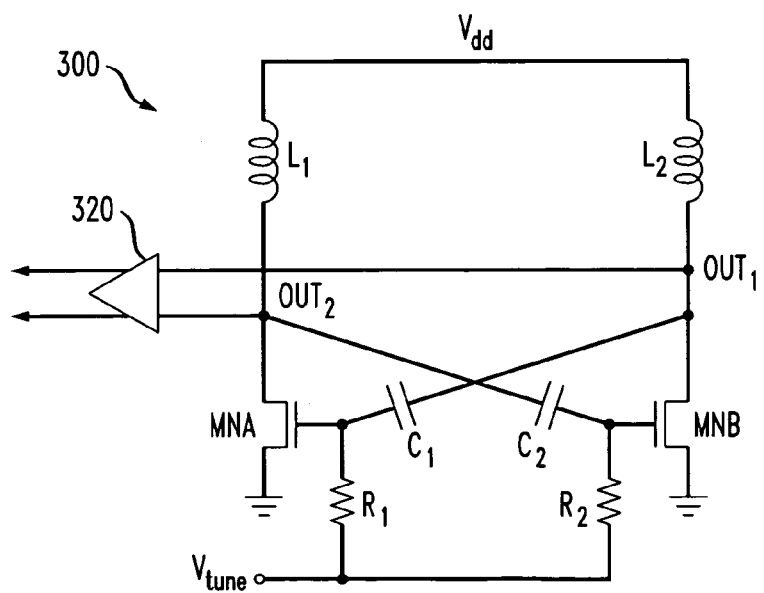
FIG. 3 is a schematic circuit diagram illustrating an oscillator circuit incorporating features of the present invention.

FIG. 3 is a schematic circuit diagram illustrating an oscillator circuit 300 incorporating features of the present invention. As discussed hereinafter, the oscillator circuit 300 is controlled by MOS varactors MNA and MNB. The MOS varactors MNA and MNB are also the MOS devices that provide the negative resistance in the LC tank circuit to sustain oscillations. Thus, the two MOS devices MNA and MNB serve two functions simultaneously. The two MOS devices MNA and MNB provide positive feedback and behave as varactors, thereby saving on component usage and reducing the area of the LC tank circuit. The varactor MNA sees the capacitance of $C_1$ and the parasitic capacitance of resistor $R_1$. In addition, the parasitic capacitance of output node $OUT_1$ is sensed through the series connection of $C_1$. Thus, the effect of the parasitic capacitance of output node $OUT_1$ has a reduced influence on the capacitance of the MOS varactor MNA. In one exemplary implementation, the tuning range at 6 GHz was simulated to be 300 MHz.

Like the oscillator circuit 100 of FIG. 1, the oscillator circuit 300 comprises the two conventional n-channel MOS devices MNA and MNB that are assumed to be substantially identical to each other. The lower or source electrode of each of the devices MNA and MNB is connected to a point of reference potential such as ground. The upper or drain electrodes of the devices MNA and MNB are connected through respective inductors $L_1$ and $L_2$ to a source $V_{dd}$. Herein, the source $V_{dd}$ will, for example, be assumed to have a value of about +2.5 volts. The gate electrode of the right-hand MOS device MNB is connected through the capacitor $C_2$ to the drain electrode of the left-hand MOS device MNA at the node point $OUT_2$. Similarly, the gate electrode of the left-hand MOS device MNA is connected through the capacitor $C_1$ to the drain electrode of the right-hand device MNB at a node point $OUT_1$. In addition, the two resistors $R_1$ and $R_2$ are connected to the gate electrode of each MOS device MNA and MNB, respectively, and a source or power supply $V_{tune}$ that will, for example, be assumed to be a direct-current supply having a value of approximately between −1.0 to +1.0 volts. The inductors $L_1$ and $L_2$, the capacitors $C_1$ and $C_2$ and the parasitic gate capacitance of devices MNA and MNB constitute the LC tank circuit for the oscillator 300.

The circuit 300 of FIG. 3 provides a sine-wave voltage output at the node point $OUT_1$ and a complementary such output at the node point $OUT_2$. In other words, the sine waves provided at the node points $OUT_1$ and $OUT_2$ are 180 degrees out of phase with respect to each other.

The outputs appearing at the node points $OUT_1$ and $OUT_2$ are connected to a load 320. Illustratively, the load 320 is capacitive in nature, such as MOS devices included in a network which is controlled by the signals generated at the node points $OUT_1$ and $OUT_2$. It is noted that it may be advantageous to provide start-up circuitry (not shown) to drive the depicted circuit into its steady-state oscillatory mode, in the manner described in U.S. Pat. No. 5,396,195. Initially, with the start-up circuitry disabled but the circuit 300 shown in FIG. 3 energized, it is possible that the voltages at the node points $OUT_1$ and $OUT_2$ will assume a condition in which they are approximately equal. In that case, the currents through the inductors $L_1$ and $L_2$ will also be approximately equal. As a result, the circuit 300 would remain in a balanced or non-oscillatory steady-state condition. By applying a start-up signal to the circuit 300, the circuit 300 is unequivocally driven into its desired oscillatory state.

The application of the start-up signal causes the voltage of the node point $OUT_1$ to be driven in a positive direction while the voltage of the node point $OUT_2$ is driven in a negative direction. At the same time, the current through the inductor $L_1$ increases while the current through the inductor $L_2$ decreases. In this manner, the initially balanced condition of the circuit 300 is altered by the start-up signal.

When the start-up signal is disabled, the oscillator circuit is in an unbalanced condition, with energy stored in the inductors $L_1$ and $L_2$ and the capacitors $C_1$ and $C_2$. Subsequently, due to the energy stored in the tank circuit and the regenerative feedback action of the cross-connected MOS devices MNA and MNB, oscillations build up until an output sine-wave signal appears at the node point $OUT_1$ and a complementary output sine-wave signal appears at the node point $OUT_2$. Each of the sine waves has a voltage that ranges approximately between 0 volts and 5 volts. The mid-point of each sine wave occurs at $V_{dd}/2$. The two sine waves are 180 degrees out of phase with respect to each other.

Among other benefits, the oscillator circuit 300 has a reduced component count, relative to the oscillator circuits 100, 200 of FIGS. 1 and 2, and offers another mechanism to control the frequency of oscillation of a CMOS LC tank circuit. This technique can be used in conjunction with conventional frequency control methods mentioned earlier to further increase the tuning range.

Figure 4:
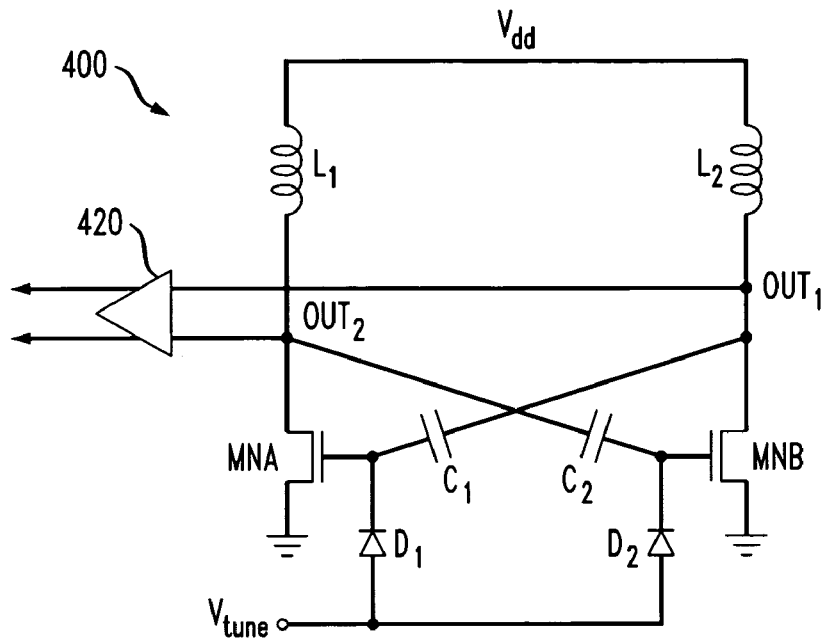
FIGS. 4 through 7 are a schematic circuit diagrams illustrating alternate oscillator circuits incorporating features of the present invention.

FIG. 4 is a schematic circuit diagram illustrating an oscillator circuit 400 incorporating features of the present invention. The oscillator circuit 400 is implemented in a similar manner to the oscillator circuit 300 of FIG. 3, except that the resistors $R_1$ and $R_2$ of FIG. 3 are replaced by diodes $D_1$ and $D_2$ (or varactors). Thus, the MOS devices MNA and MNB are cross-coupled using a combination of the capacitors $C_1$ and $C_2$, and diodes $D_1$ and $D_2$. In this case, the diodes $D_1$ and $D_2$ control the biasing of devices MNA and MNB as well as adding an additional capacitance that can be added to the tank circuit.

Figure 5:
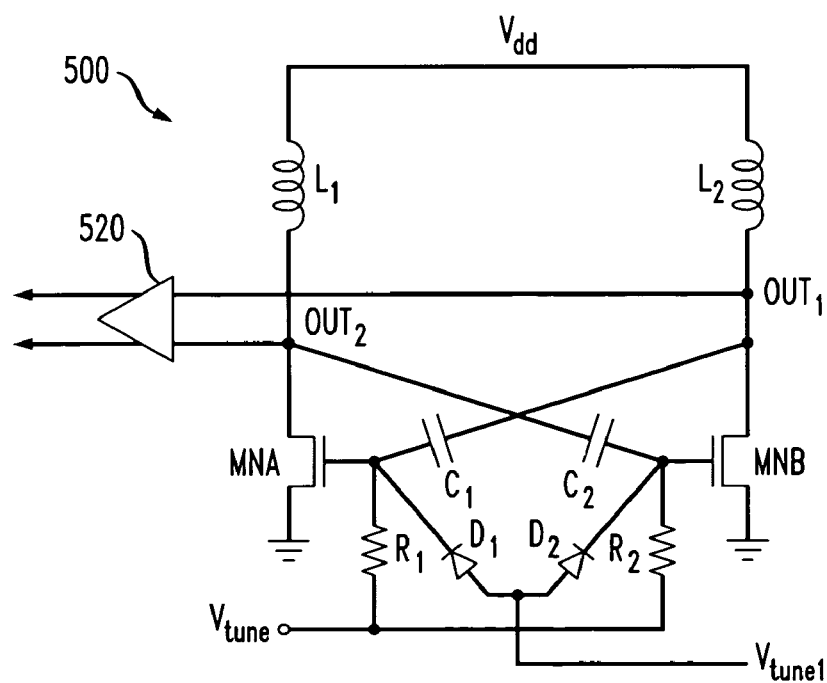

FIG. 5 is a schematic circuit diagram illustrating an oscillator circuit 500 incorporating features of the present invention. The oscillator circuit 500 is implemented in a similar manner to the oscillator circuit 300 of FIG. 3, except that the oscillator circuit 500 also includes a pair of diodes $D_1$ and $D_2$ that are connected to the gate of the MOS devices MNA and MNB as well as resistors $R_1$ and $R_2$ controlled by potential $V_{tune}$. Thus, the MOS devices MNA and MNB are cross-coupled using a combination of the capacitors $C_1$ and $C_2$, resistors $R_1$ and $R_2$ and diodes $D_1$ and $D_2$. Now, there are two relatively independent controls to adjust the frequencies of oscillation, namely, $V_{tune1}$ and $V_{tune}$.

Figure 6:
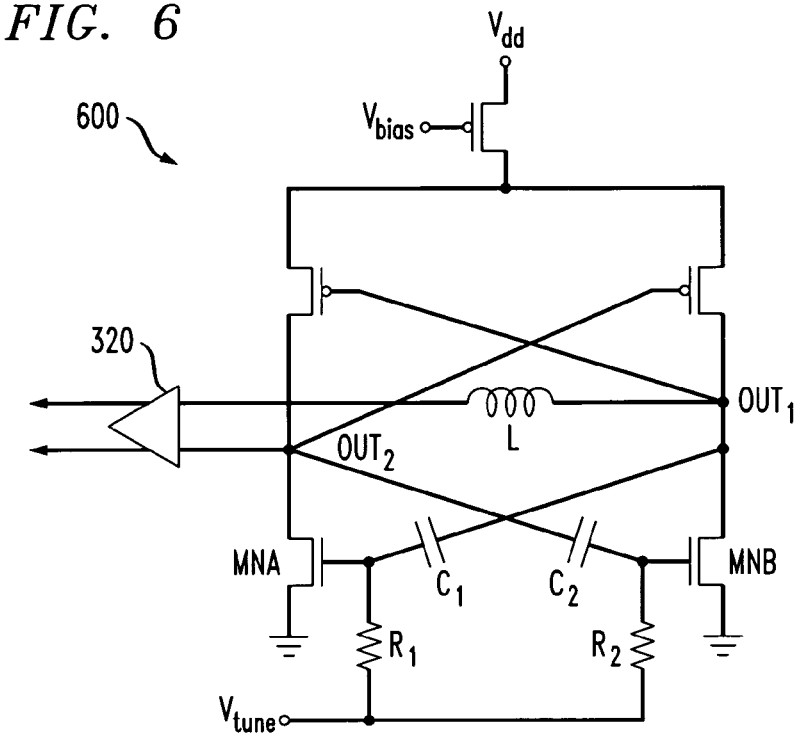
Figure 7:
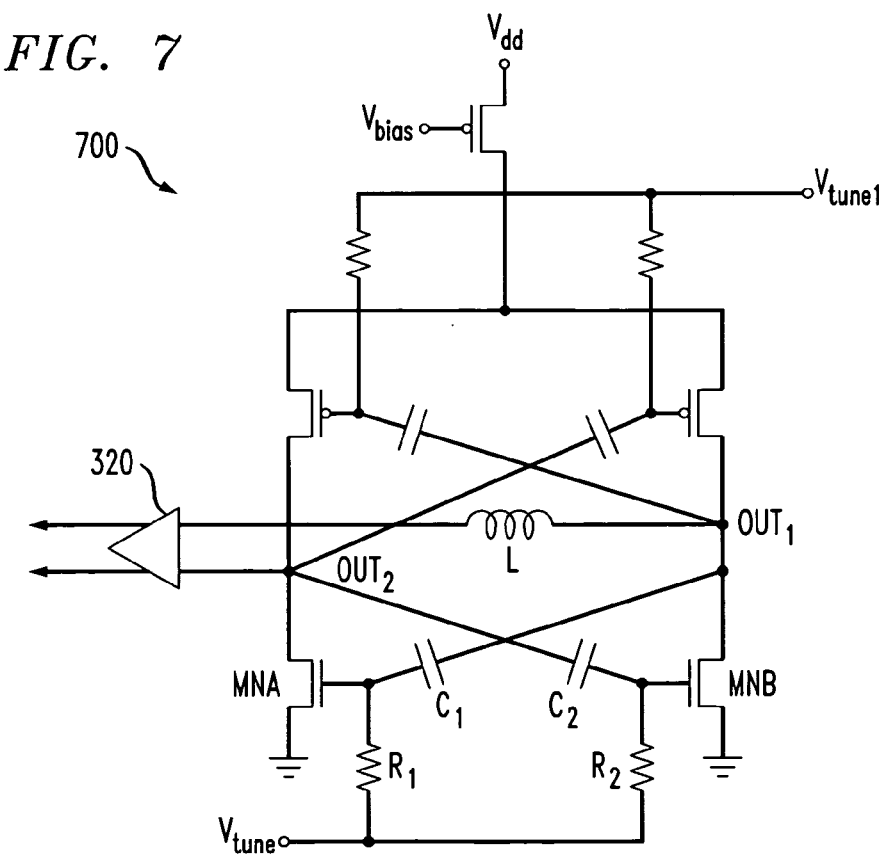

FIGS. 6 and 7 are schematic circuit diagrams illustrating oscillator circuits 600, 700 incorporating features of the present invention. The oscillator circuits 600, 700 are implemented in a similar manner to the oscillator circuit 300 of FIG. 3, except that the oscillator circuits 600, 700 also includes a pair of cross-coupled p-channel devices. The oscillator circuit 700 further includes corresponding capacitors connected to the gates of the top two cross-coupled p-channel devices.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. An oscillator circuit, comprising:
   at least two MOS devices;
   a first reactance connecting a drain electrode of a first MOS device to a gate electrode of a second MOS device and a second reactance connecting a drain electrode of said second MOS device to a gate electrode of said first MOS device;

a tank circuit connected to said source and drain electrodes; and at least a first diode and a second diode, said at least first and second diodes connected to said tank circuit and wherein said first diode is configured to adjust a biasing of said first MOS device and wherein said second diode is configured to adjust a biasing of said second MOS device.

2. The oscillator circuit of claim 1, wherein each of said first and second reactance comprises a capacitor.

3. The oscillator circuit of claim 1, wherein each of said first and second reactance comprises a diode.

4. The oscillator circuit of claim 1, further comprising one or more resistors connected to a gate electrode of at least one of said MOS device and a power source.

5. The oscillator circuit of claim 1, further including means for connecting said source electrode to a reference potential.

6. The oscillator circuit of claim 1, further including means for connecting said drain electrode to a source of potential.

7. The oscillator of claim 1, wherein said tank circuitry comprises one or more capacitors and inductors.

8. The oscillator circuit of claim 1, further including start-up circuitry.

9. A method for adjusting the frequency tuning range of an oscillator circuit, comprising the steps of:

generating an oscillating signal using a pair of MOS devices and an associated tank circuit;

generating a voltage at a gate of one or more of said MOS devices using a first reactance connected between a drain electrode of a first MOS device and a gate electrode of a second MOS device and a second reactance connected between a drain electrode of said second MOS device and a gate electrode of said first MOS device; and adjusting a frequency of said oscillating signal by biasing one or more of first and second said MOS devices, wherein said biasing is performed utilizing a first diode that adjusts a biasing of said first MOS device and a second diode that adjusts a biasing of said second MOS device; the diodes also connected to said tank circuit.

10. The method of claim 9, further comprising the step of generating a bias using one or more resistors connected to a gate electrode of at least one of said MOS device and a power source.

11. The method of claim 9, further comprising the step of connecting said source electrode to a reference potential.

12. The method of claim 9, further comprising the step of connecting said drain electrode to a source of potential.

13. An integrated circuit, comprising:
an oscillator circuit comprising:
at least two MOS devices;

a first reactance connecting a drain electrode of a first MOS device to a gate electrode of a second MOS device and a second reactance connecting a drain electrode of said second MOS device to a gate electrode of said first MOS device;

a tank circuit connected to said source and drain electrodes; and at least a first diode and a second diode, said at least first and second diodes connected to said tank circuit and wherein said first diode is configured to adjust a biasing of said first MOS device and wherein said second diode is configured to adjust a biasing of said second MOS device.

14. The integrated circuit of claim 13, wherein each of said first and second reactance comprises a capacitor.

15. The integrated circuit of claim 13, wherein each of said first and second reactance comprises a diode.

16. The integrated circuit of claim 13, further comprising one or more resistors connected to a gate electrode of at least one of said MOS device and a power source.

17. The integrated circuit of claim 13, further including means for connecting said source electrode to a reference potential.

18. The integrated circuit of claim 13, further including means for connecting said drain electrode to a source of potential.

19. The oscillator of claim 1, wherein said tank circuitry comprises one or more capacitors and inductors.

20. The integrated circuit of claim 13, further including start-up circuitry.

21. An oscillator circuit, comprising:
at least two MOS devices;

a first reactance connecting a drain electrode of a first MOS device to a gate electrode of a second MOS device and a second reactance connecting a drain electrode of said second MOS device to a gate electrode of said first MOS device;

a cross-coupled transistor pair, said cross-coupled transistor pair comprising a third MOS device, a fourth MOS device, a first reactance connecting a drain electrode of said third MOS device to a gate electrode of said fourth MOS device and a second reactance connecting a drain electrode of said fourth MOS device to a gate electrode of said third MOS device, wherein a bias control signal is configured to adjust an average DC value of an output of said oscillator circuit; and a tank circuit connected to said drain electrode of said first MOS device and said drain electrode of said second MOS device.

* * * * *

UNITED STATES PATENT AND TRADEMARK OFFICE
CERTIFICATE OF CORRECTION

| | | |
|---|---|---|
| PATENT NO. | : 7,274,264 B2 | Page 1 of 1 |
| APPLICATION NO. | : 11/020023 | |
| DATED | : September 25, 2007 | |
| INVENTOR(S) | : Gabara et al. | |

It is certified that error appears in the above-identified patent and that said Letters Patent is hereby corrected as shown below:

Col. 7, line 3, before "and" replace "source" with --gate--.

Col. 8, line 9, before "and" replace "source" with --gate--.

Signed and Sealed this
Fifth Day of April, 2011

David J. Kappos
*Director of the United States Patent and Trademark Office*